US007944255B2

(12) United States Patent
Shimizu

(10) Patent No.: US 7,944,255 B2

(45) Date of Patent: May 17, 2011

(54) CMOS BIAS CIRCUIT

(75) Inventor: Kan Shimizu, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/563,575

(22) Filed: Sep. 21, 2009

(65) Prior Publication Data

US 2010/0231289 A1 Sep. 16, 2010

(30) Foreign Application Priority Data

Mar. 16, 2009 (JP) ................................ 2009-062373

(51) Int. Cl.
*H03L 7/00* (2006.01)

(52) U.S. Cl. ....................................... 327/143; 327/543

(58) Field of Classification Search .................. 327/142, 327/143, 535, 538, 543

See application file for complete search history.

(56) References Cited

U.S. PATENT DOCUMENTS 7,015,746 B1 * 3/2006 Martinez et al. .............. 327/543
7,589,573 B2 * 9/2009 Tang et al. .................... 327/143

FOREIGN PATENT DOCUMENTS

JP 2003-110032 4/2003
JP 2004-252886 9/2004
JP 2009003530 1/2009
JP 2009-104452 5/2009

* cited by examiner

*Primary Examiner* — Jeffrey S Zweizig

(74) *Attorney, Agent, or Firm* — Turocy & Watson, LLP

(57) ABSTRACT

A CMOS bias circuit includes a starter circuits and a started circuit part which supplies a current to the outside. The starter circuits has a connection node (first terminal) between it and the started circuit part. The starter circuits includes a first MOS transistor connected at its drain to the first terminal, a first current supply circuit which supplies a starter current to the started circuit via the first MOS transistor, and a circuit which supplies a second current in a direction that interrupts a current flowing through the first MOS transistor to a node between the first MOS transistor and the first current supply circuit in accordance with a potential at the first terminal. The starter circuits has a function of preventing a current flowing between the drain and source of the first MOS transistor in the opposite direction by increasing or decreasing a gate bias of the first MOS transistor in accordance with a value of the second current.

20 Claims, 2 Drawing Sheets

CMOS BIAS CIRCUIT

CROSS-REFERENCE TO RELATED APPLICATION

This application is based upon and claims the benefit of priority from the prior Japanese Patent Application No. 2009-62373, filed on Mar. 16, 2009, the entire contents of which are incorporated herein by reference.

BACKGROUND OF THE INVENTION

1. Field of the Invention

The present invention relates to a CMOS bias circuit having a starter circuits.

2. Background Art

A conventional semiconductor integrated circuit includes a starter circuits part 3, a constant current circuit part 4, and an output takeout circuit part 5 (see, for example, Japanese Patent Laid-Open No. 2003-110032 (FIG. 5)).

The constant current circuit part 4 has two stable operating points. At one of the two operating points, both currents I1 and I2 are zero. The other of the two operating points is a desired operating point, which is an operating point depending upon size ratios W/L and differences between threshold voltages of transistors M1 to M4, and a resistance value of a resistor R1. If the currents I1 and I2 are provided with suitable starter currents at the desired operating point, and the constant current circuit part 4 makes a transition to the desired operating point or the constant current circuit part 4 satisfies a condition for transition to the desired operating point, then it is necessary to remove the starter current and thereby prevent the constant current circuit part 4 from deviating from the desired operation point.

A resistor R2 and transistors M5, M6, M8 and M9 in the starter circuits part 3 supplies a starter current I4 to the constant current circuit part 4, and the constant current circuit part 4 supplies a gate bias voltage to a transistor M7 in the starter circuits part 3.

When the constant current circuit part 4 is conducting the desired operation, the transistor M7 supplied with the gate bias voltage supplies a current I5 to a connection node between the transistor M8 and the transistor M9 to stop the starter current. If the current I5 exceeds the current supply capability of the transistor M9, then the potential at the connection node between the transistor M8 and the transistor M9 rises, and the transistor M8 is biased to turn off, the current I4 being interrupted.

For example, when using the semiconductor integrated circuit with a lower power supply voltage, there is a problem that the current of the transistor M8 is not interrupted.

The transistor M8 is a current controlled current switch transistor for interrupting the current output from the transistor M9. If the potential difference between the power supply and the ground is small (the power supply voltage is low), the potential at the drain of the transistor M8 might become lower than the potential at the gate of the transistor M8.

If the potential difference between the gate potential and the drain potential (VCP potential at the output of the starter circuits part 3) becomes higher than a threshold voltage Vth of the transistor M8, then a current which is opposite in direction to the starter current I4 flows through the transistor M8 and exerts an influence upon the VCP potential.

For example, the opposite direction current of the transistor M8 changes the currents I1 and I2 of the constant current circuit part 4 to values which are different from those intended, and the deviations are influenced by the power supply voltage.

In this way, when the power supply voltage is low, the conventional art has a problem that the current which is opposite in direction to the starter current flows through the current controlled current switch transistor and influence of the variation of the power supply voltage is exerted upon a started circuit part (the constant current circuit part 4 and an output takeout circuit part 5) via the starter circuits part 3.

SUMMARY OF THE INVENTION

According to one aspect of the present invention, there is provided: a CMOS bias circuit comprising:

a starter circuits including a starter current supply part which outputs a starter current to a first terminal, and a starter current stop control part which controls output stop of the starter current; and a started circuit part which is supplied with the starter current via the first terminal and which increases or decreases an internal current in accordance with the starter current and generates at the first terminal a voltage depending upon the internal current, wherein the starter current supply part includes a first MOS transistor connected at a drain thereof to the first terminal, and a first current supply circuit which is connected at a first end thereof to a source of the first MOS transistor and which outputs a first current, and a gate bias of the first MOS transistor increases or decreases depending upon a starter current stop control current, the starter current stop control part supplies the starter current stop control current obtained from the internal current of the started circuit by using an approximate current mirror to a node between the source of the first MOS transistor and the first current supply circuit, and if the starter current is zero and the internal current has a value which is at least a first current value, then the internal current increases up to a second current value and settles, whereas if the starter current is zero and the internal current has a value which is less than the first current value, then the internal current settles with a current value which is less than the second current value.

According to another aspect of the present invention, there is provided: a CMOS bias circuit comprising:

a starter circuits including a starter current supply part which outputs a starter current to a first terminal, and a starter current stop control part which controls output stop of the starter current; and a started circuit part which is supplied with the starter current via the first terminal and which increases or decreases an internal current in accordance with the starter current and generates at the first terminal a voltage depending upon the internal current, wherein the starter current supply part includes a first MOS transistor connected at a drain thereof to the first terminal, and a first current supply circuit which is connected at a first end thereof to a source of the first MOS transistor and which outputs a first current in response to an external signal input from outside of the starter circuits, and a gate bias of the first MOS transistor increases or decreases depending upon a starter current stop control current, the starter current stop control part supplies the starter current stop control current obtained from the internal current of the started circuit by using an approximate current mirror to a node between the source of the first MOS transistor and the first current supply circuit, and if the starter current is zero and the internal current has a value which is at least a first current value, then the internal current increases up to a second current value and settles, whereas if the starter current is zero and the internal current has a value which is less than the first current value, then the internal current settles with a current value which is less than the second current value.

According to still another aspect of the present invention, there is provided: a CMOS bias circuit comprising:

a starter circuits including a starter current supply part which outputs a starter current to a first terminal, and a starter current stop control part which controls output stop of the starter current; and a started circuit part which is supplied with the starter current via the first terminal and which increases or decreases an internal current in accordance with the starter current and generates at the first terminal a voltage depending upon the internal current, wherein the starter current supply part includes a first MOS transistor connected at a drain thereof to the first terminal, and a first current supply circuit which is connected at a first end thereof to a source of the first MOS transistor and which outputs a first current in response to an internal signal input from inside of the starter circuits, and a gate bias of the first MOS transistor increases or decreases depending upon a starter current stop control current, the starter current stop control part supplies the starter current stop control current obtained from the internal current of the started circuit by using an approximate current mirror to a node between the source of the first MOS transistor and the first current supply circuit, and if the starter current is zero and the internal current has a value which is at least a first current value, then the internal current increases up to a second current value and settles, whereas if the starter current is zero and the internal current has a value which is less than the first current value, then the internal current settles with a current value which is less than the second current value.

DETAILED DESCRIPTION

First Embodiment

Figure 1:
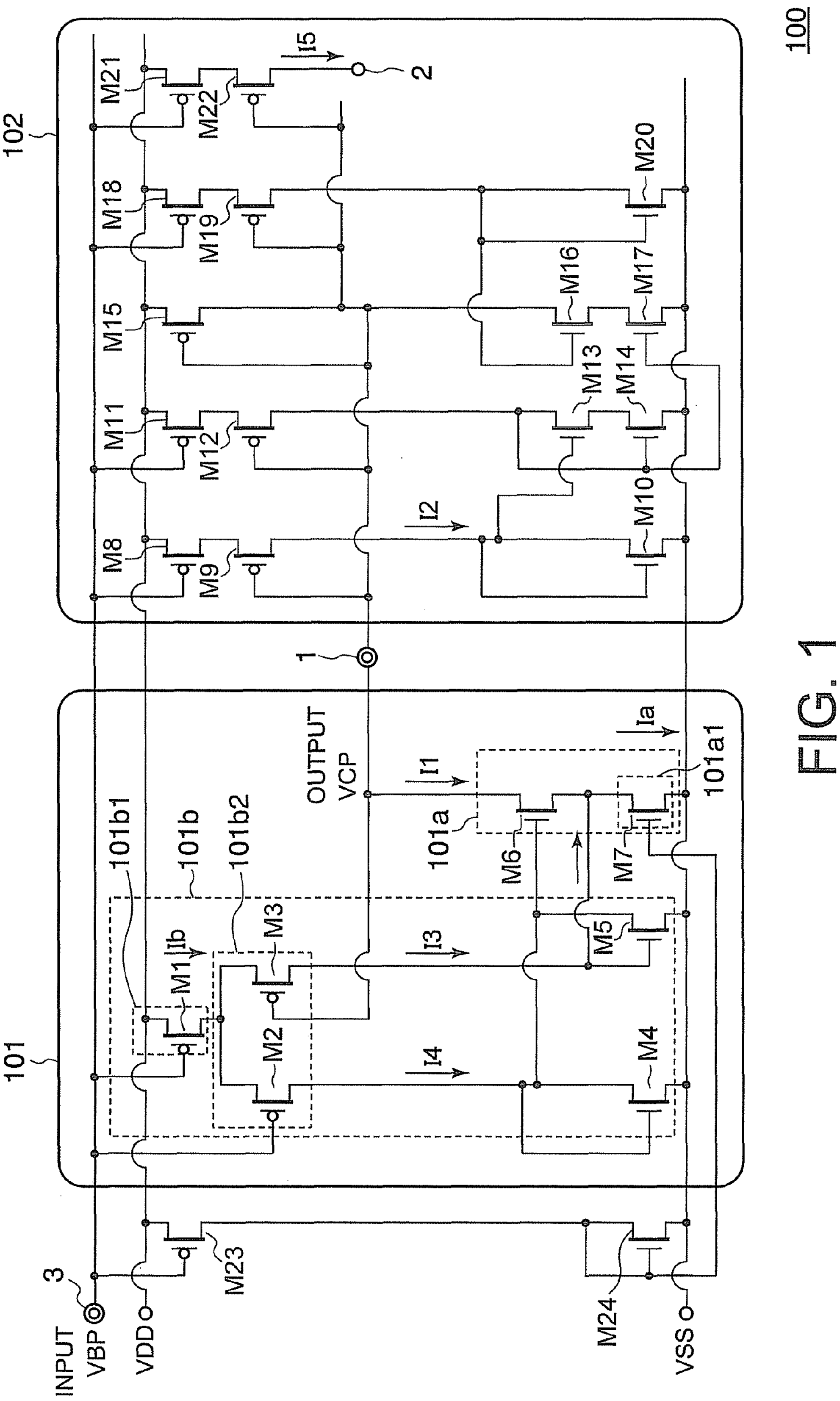
FIG. 1 is a circuit diagram showing a configuration of a CMOS bias circuit 100 according to a first embodiment which is a mode of the present invention.

FIG. 1 is a circuit diagram showing a configuration of a CMOS bias circuit 100 according to a first embodiment which is a mode of the present invention. As shown in FIG. 1, MOS transistors M1 to M3, M8, M9, M11, M12, M15, M18, M19, and M21 to M23 are pMOS transistors, whereas M4 to M7, M10, M13, M14, M16, M17, M20 and M24 are nMOS transistors.

As shown in FIG. 1, the CMOS bias circuit 100 includes a starter circuits 101 and a started circuit part 102.

The starter circuits 101 includes a starter current supply part 101*a* and a starter current stop control part 101*b*.

The starter current supply part 101*a* is adapted to output a starter current I1 to a first terminal 1.

The starter current supply part 101*a* includes a MOS transistor M6 connected at its drain to the first terminal 1, and a first current supply circuit 101*a*1.

The first current supply circuit 101*a*1 is connected at its drain to the MOS transistor M6 at its source, and connected at its source to a ground terminal. The first current supply circuit 101*a*1 is adapted to output a first current Ia obtained from a current flowing through MOS transistors M23 and M24 by using an approximate current mirror, in response to a voltage of an external signal INPUT_VBP input from outside of the starter circuits via an external terminal 3.

The first current supply circuit 101*a*1 is a MOS transistor M7 which is connected between the source of the MOS transistor M6 and the ground terminal to construct the mirror circuit in conjunction with the MOS transistor M24.

The starter current stop control part 101*b* controls output stop of the starter current I1. The starter current stop control part 101*b* includes a second current supply circuit 101*b*1 and a current changeover circuit 101*b*2.

The second current supply circuit 101*b*1 is adapted to output a second current Ib supplied from the power supply. The second current supply circuit 101*b*1 is a MOS transistor M1 connected at its source to the power supply, connected at its drain to the current changeover circuit 101*b*2, and connected at its gate to the external terminal 3.

The current changeover circuit 101*b*2 branches the second current Ib to a bias current I4 for controlling a gate voltage of the MOS transistor M6 and a starter current stop control current I3, and controls the route of the second current Ib in accordance with a voltage at the first terminal 1.

The current changeover circuit 101*b*2 includes a MOS transistor M2 and a MOS transistor M3.

The starter current stop control part 101*b* further includes a MOS transistor M4 and a MOS transistor M5.

The MOS transistor M4 is diode-connected between drain of the MOS transistor M2 and the ground terminal.

The MOS transistor M2 is connected at its source to drain of the MOS transistor M1, connected at its drain to the MOS transistor M6 at its gate, connected at its drain to drain of the diode-connected MOS transistor M4 which converts a current supplied from the MOS transistor M2 to a bias voltage, and connected at its gate to the external terminal 3.

The MOS transistor M3 is connected at its source to the drain of the MOS transistor M1, connected at its drain to the source of the MOS transistor M6, and connected at its gate to the first terminal 1.

The MOS transistor M5 (a gate bias circuit) is connected at its drain to the gate of the MOS transistor M6, connected at its source to the source of the MOS transistor M7 (the first current supply circuit 101*a*1), and connected at its gate to the source of the MOS transistor M6. If the starter current stop control current 13 exceeds the current supply capability of the MOS transistor M7, then the MOS transistor M5 decreases the gate bias of the MOS transistor M6 so as to turn off the MOS transistor M6. In addition, parameters such as transistors W/L size, current values are adjusted so as to prevent the potential at the source of the MOS transistor M6 from decreasing the gate bias of the MOS transistor M5 when the started circuit 102 is not started.

The MOS transistor M6 can be turned off more positively by the MOS transistor M5.

The started circuit part 102 includes MOS transistors M8 to M21 and a second terminal 2.

The started circuit part 102 is supplied with the starter current I1 via the first terminal 1. The started circuit part 102 is adapted to increase or decrease an internal current I2 according to the starter current I1 and output a voltage depending upon the internal current I2 to the first terminal 1.

If the internal current I2 has a value which is at least a first current value, then the started circuit part 102 increases the internal current I2 to a second current value. In addition, if the starter current I1 is zero, then the started circuit part 102 stabilizes the internal current I2 at the second current value. In addition, if the starter current I1 is zero and the internal current I2 has a value which is less than the first current value, then the started circuit part 102 stabilizes the internal current I2 at a current value which is less than the second current value. In addition, the started circuit part 102 increases the internal current I2 to at least the first current value in response to the starter current I1 which is greater than zero.

In addition, the first current value is a current value of a current which flows through a MOS transistors M9 when it is in a state close to the off state. In other words, the first current value depends upon not only design parameters of the started circuit part 102 but also matching dispersion of the started circuit part 102. The first current value becomes, for example, approximately one tenth of the second current value.

The second current value is a current value of the internal current I2 which depends upon a potential difference between the power supply voltage and the voltage of the external signal INPUT_VBP and the manufacture process and a size ratio W/L of the MOS transistors M8. In other words, the second current value is a current value of the internal current I2 in a stationary state in which the starter current I1 ceases to flow.

Upon being started, the started circuit part 102 outputs a predetermined output current I5 from the second terminal 2.

The MOS transistor M8, M9 and the MOS transistor M1, M3 constitute a mirror circuit. The starter current stop control part 101*b* supplies the starter current stop control current I3 obtained from the internal current I2 by using an approximate current mirror to the source of the MOS transistor M6.

If the internal current I2 is less than the first current value, then the current changeover circuit 101*b*2 in the starter circuits 101 changes over a route of the second current Ib (causes the MOS transistor M3 to approach its off-state) so as to raise the gate voltage of the MOS transistor M6 (i.e., turn on the MOS transistor M6) to decrease the starter current stop control current I3.

If the internal current I2 is at least the first current value, then the current changeover circuit 101*b*2 changes over the route of the second current Ib (causes the MOS transistor M3 to approach its on-state) so as to increase the starter current stop control current I3.

In this way, the starter current stop control part 101*b* controls the output stop of the starter current I1.

An example of operation of the CMOS bias circuit 100 having the configuration heretofore described will now be described.

The second current Ib flowing through the MOS transistor M1 is divided into the starter current stop control current I3 and the bias current I4 by the current changeover circuit 101*b*2 (MOS transistors M2 and M3).

If the started circuit 102 is not started (if the internal current I2 is less than the first current value), then the current changeover circuit 101*b*2 decreases the starter current stop control current I3, and increases the bias current I4. As a result, the gate bias of the MOS transistors M6 generated by a voltage drop which is caused by the bias current I4 is increased. Accordingly, the MOS transistors M6 turns on sufficiently and the starter current I1 increases.

If the started circuit 102 is already started (if the internal current I2 has a value which is at least the first current value), then an increase of the internal current I2 increases the starter current stop control current I3 and decreases the bias current I4 in the current changeover circuit 101*b*2. As a result, the gate bias of the MOS transistors M6 decreases.

In this way, the bias circuit 100 decreases the gate bias of the MOS transistors M6 in the starter current supply part 101*a* in accordance with the internal current I2 in the started circuit 102.

If the started circuit 102 is already started (if the internal current I2 has a value which is at least the first current value), therefore, the gate-drain voltage of the MOS transistors M6 is made lower than a threshold voltage Vth of the MOS transistor M6.

Since the gate bias of the MOS transistor M6 is decreased by the internal current I2 in the started circuit as described above, the MOS transistor M6 turns off and a current which is opposite in direction to the starter current I1 can be prevented from flowing through the MOS transistor M6.

If the source potential of the MOS transistor M6 rises to at least a threshold voltage Vth of the MOS transistor M5, the MOS transistor M5 turns on. As a result, the gate bias of the MOS transistor M6 decreases.

If the starter current stop control current I3 is zero when the MOS transistor M6 is in the off-state, then the gate voltage of the MOS transistor M5 is pulled down by a current which flows through the MOS transistor M7. As a result, the MOS transistor M6 does not fall into a deadlock state in a conductible state.

If the started circuit 102 is already started, then the starter current stop control current I3 for supplying the gate voltage of the MOS transistor M6 is larger than that in the case where the started circuit 102 is not started, and consequently the gate voltage of the MOS transistor M6 becomes low. As a result, the gate bias of the MOS transistor M6 in the case where the drain of the MOS transistor M6 is regarded as the source also becomes shallow.

As compared with the conventional art, therefore, the opposite direction current of the MOS transistor M6 which is a current controlled current switch becomes hard to flow even with a lower power supply voltage.

In addition, since the MOS transistor M5 detects the source potential of the MOS transistor M6 and turns on to decrease the gate bias of the MOS transistor M6, it is possible to cut off the MOS transistor M6 certainly.

In addition, an effect is obtained by selectively using either the MOS transistor M5 or a part obtained by excluding the MOS transistor M5 in the starter current stop control part 101*b*. The starter current can be cut off more certainly by using both of them.

As heretofore described, the CMOS bias circuit 100 can prevent the opposite direction current from flowing through the MOS transistor M6 for cutting off the current output of the starter current supply part 101*a* and mitigate the influence of the variation of the power supply voltage VDD exerted upon the started circuit 102 via the starter circuits.

In the above-described configuration, the gate bias of the transistor is controlled. However, the configuration functions to nearly cut off the starter current by using the current and make the cutoff more certain by the gate bias control. Therefore, the characteristic that the overshoot of the output current is small because the delay time of the starter current cutoff is short which is an advantage obtained in the case where the current controlled current switch is used in the starter circuits in the conventional art is not hampered.

According to the CMOS bias circuit in the present invention, a negative starter current does not flow even when the power supply voltage is low as 1V and the influence of the power supply voltage variation upon the internal current of the started circuit part, and eventually the output current variation is lightened as heretofore described.

Second Embodiment

In the first embodiment, the current flowing through the MOS transistor M7 which is the first current supply circuit depends upon the external signal INPUT_VBP. However, the current flowing through the MOS transistor M7 may depend upon an internal signal generated within the CMOS bias circuit.

In a second embodiment, therefore, an example of a circuit configuration in which the current flowing through the MOS transistor M7 which is the first current supply circuit depends upon an internal signal generated within the CMOS bias circuit will be described.

Figure 2:
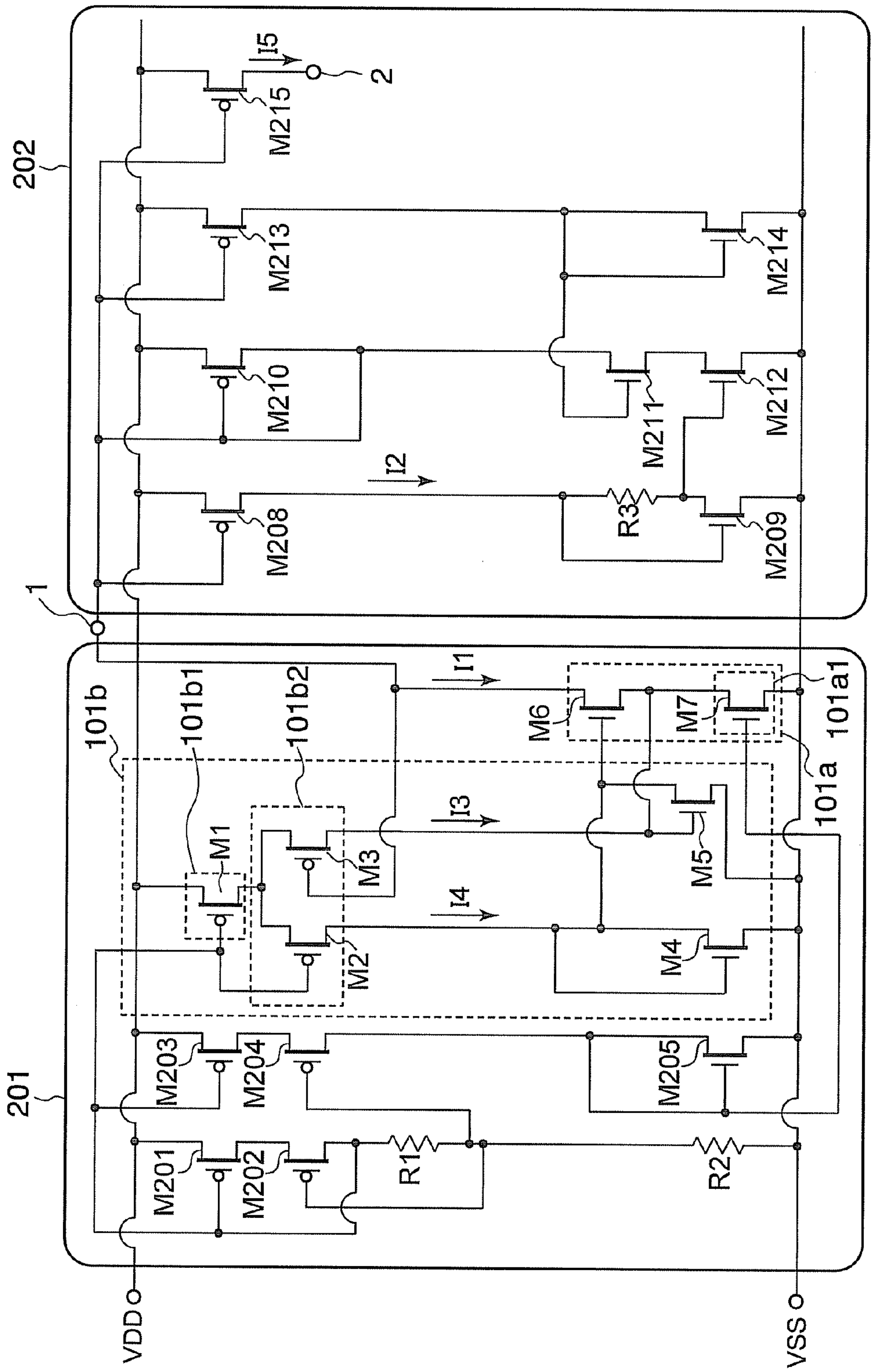
FIG. 2 is a circuit diagram showing a configuration of a CMOS bias circuit 200 according to a second embodiment which is a mode of the present invention.

FIG. 2 is a circuit diagram showing a configuration of a CMOS bias circuit 200 according to the second embodiment which is a mode of the present invention. In FIG. 2, the same characters as those in FIG. 1 denote like elements in the first embodiment.

As shown in FIG. 2, the CMOS bias circuit 200 includes a starter circuits 201 and a started circuit part 202.

The starter circuits 201 includes a starter current supply part 101*a*, a starter current stop control part 101*b*, MOS transistors M201 to M205, and resistor elements R1 and R2. In addition, operation of the starter current supply part 101*a* and the starter current stop control part 101*b* of the starter circuits 201 is the same way as that in the starter circuits 101 in the first embodiment.

The first current supply circuit 101*a*1 is connected at its first end to a MOS transistor M6 at its source, and connected at its second end to a ground terminal. The first current supply circuit 101*a*1 is adapted to output a first current Ia obtained from a current flowing through MOS transistors M201 and M202 by using an approximate current mirror, in accordance with an internal voltage.

The first current supply circuit 101*a*1 is a MOS transistor M7 which is connected between the source of the MOS transistor M6 and the ground terminal and which constitutes a mirror circuit in conjunction with the MOS transistor M205. A current flowing through the MOS transistor M205 is generated by the MOS transistors M201 to M204, and the resistor elements R1 and R2.

In this way, the current flowing through the MOS transistor M7 depends upon the internal signal generated within the CMOS bias circuit 200.

The started circuit part 202 includes MOS transistors M208 to M215, a resistor element R3, and a second terminal 2.

The started circuit part 202 is supplied with a starter current I1 via a first terminal 1. The started circuit part 202 is adapted to let an internal current I2 depending upon the starter current I1 flow and apply a voltage depending upon the internal current I2 to the first terminal 1.

Upon being started, the started circuit part 202 outputs a predetermined output current I5 from the second terminal 2 in the same way as the started circuit part 102 in the first embodiment.

Operation of the CMOS bias circuit 200 having the configuration heretofore described is similar to that of the CMOS bias circuit 100 in the first embodiment.

In other words, the CMOS bias circuit 200 can prevent the opposite direction current from flowing through the MOS transistor M6 for cutting off the current output of the starter current supply part 101*a* and mitigate the influence of the variation of the power supply voltage VDD exerted upon the started circuit 102 via the starter circuits, in the same way as the first embodiment.

According to the CMOS bias circuit in the present invention, a negative starter current does not flow even when the power supply voltage is low as 1V and the influence of the power supply voltage variation upon the internal current of the started circuit part, and eventually the output current variation is lightened as heretofore described.

What is claimed is:

1. A CMOS bias circuit comprising:

a starter circuit including a starter current supply part which outputs a starter current to a first terminal, and a starter current stop control part which controls output stop of the starter current; and a started circuit part which is supplied with the starter current via the first terminal and which increases or decreases an internal current in accordance with the starter current and generates at the first terminal a voltage depending upon the internal current, wherein the starter current supply part includes a first MOS transistor connected at a drain thereof to the first terminal, and a first current supply circuit which is connected at a first end thereof to a source of the first MOS transistor and which outputs a first current, and a gate bias of the first MOS transistor increases or decreases depending upon a starter current stop control current, the starter current stop control part supplies the starter current stop control current obtained from the internal current of the started circuit by using an approximate current mirror to a node between the source of the first MOS transistor and the first current supply circuit, and if the starter current is zero and the internal current has a value which is at least a first current value, then the internal current increases up to a second current value and settles, whereas if the starter current is zero and the internal current has a value which is less than the first current value, then the internal current settles with a current value which is less than the second current value.

2. The CMOS bias circuit according to claim 1, wherein the starter current stop control part comprises:

a gate bias circuit for the first MOS transistor;

a second current supply circuit which outputs a second current; and a current changeover circuit which changes over a path for the second current based on the voltage at the first terminal either to lead the second current to the gate bias circuit and increase the gate bias of the first MOS transistor or to lead the second current to a node between the source of the first MOS transistor and the first current supply circuit to supply the second current as the starter current stop control current, wherein if the voltage at the first terminal indicates that the internal current is less than the first current value, the second current is led to the gate bias circuit, whereas if the voltage at the first terminal indicates that the internal current is at least the first current value, the second current is led to the node between the source of the first MOS transistor and the first current supply circuit.

3. The CMOS bias circuit according to claim 1, wherein the first current supply circuit includes a second MOS transistor connected at a drain thereof to the source of the first MOS transistor, and has a current flowing through the second MOS transistor as an output thereof, and the starter current stop control part includes a third MOS transistor connected at a drain thereof to the gate of the first MOS transistor, connected at a gate thereof to a node between the source of the first MOS transistor and the drain of the second MOS transistor, and connected at a source thereof to a source of the second MOS transistor.

4. The CMOS bias circuit according to claim 1, wherein the first current supply circuit is a MOS transistor.

5. The CMOS bias circuit according to claim 2, wherein the first current supply circuit is a MOS transistor.

6. The CMOS bias circuit according to claim 2, wherein the second current supply circuit is a MOS transistor.

7. The CMOS bias circuit according to claim 2, wherein the first current supply circuit and the second current supply circuit are MOS transistors.

8. A CMOS bias circuit comprising:

a starter circuit including a starter current supply part which outputs a starter current to a first terminal, and a starter current stop control part which controls output stop of the starter current; and a started circuit part which is supplied with the starter current via the first terminal and which increases or decreases an internal current in accordance with the starter current and generates at the first terminal a voltage depending upon the internal current, wherein the starter current supply part includes a first MOS transistor connected at a drain thereof to the first terminal, and a first current supply circuit which is connected at a first end thereof to a source of the first MOS transistor and which outputs a first current in response to an external signal input from outside of the starter circuits, and a gate bias of the first MOS transistor increases or decreases depending upon a starter current stop control current, the starter current stop control part supplies the starter current stop control current obtained from the internal current of the started circuit by using an approximate current mirror to a node between the source of the first MOS transistor and the first current supply circuit, and if the starter current is zero and the internal current has a value which is at least a first current value, then the internal current increases up to a second current value and settles, whereas if the starter current is zero and the internal current has a value which is less than the first current value, then the internal current settles with a current value which is less than the second current value.

9. The CMOS bias circuit according to claim 8, wherein the starter current stop control part comprises:

a gate bias circuit for the first MOS transistor;

a second current supply circuit which outputs a second current; and a current changeover circuit which changes over a path for the second current based on the voltage at the first terminal either to lead the second current to the gate bias circuit and increase the gate bias of the first MOS transistor or to lead the second current to a node between the source of the first MOS transistor and the first current supply circuit to supply the second current as the starter current stop control current, wherein if the voltage at the first terminal indicates that the internal current is less than the first current value, the second current is led to the gate bias circuit, whereas if the voltage at the first terminal indicates that the internal current is at least the first current value, the second current is led to the node between the source of the first MOS transistor and the first current supply circuit.

10. The CMOS bias circuit according to claim 8, wherein the first current supply circuit includes a second MOS transistor connected at a drain thereof to the source of the first MOS transistor, and has a current flowing through the second MOS transistor as an output thereof, and the starter current stop control part includes a third MOS transistor connected at a drain thereof to the gate of the first MOS transistor, connected at a gate thereof to a node between the source of the first MOS transistor and the drain of the second MOS transistor, and connected at a source thereof to a source of the second MOS transistor.

11. The CMOS bias circuit according to claim 8, wherein the first current supply circuit is a MOS transistor.

12. The CMOS bias circuit according to claim 9, wherein the first current supply circuit is a MOS transistor.

13. The CMOS bias circuit according to claim 9, wherein the second current supply circuit is a MOS transistor.

14. The CMOS bias circuit according to claim 9, wherein the first current supply circuit and the second current supply circuit are MOS transistors.

15. A CMOS bias circuit comprising:

a starter circuit including a starter current supply part which outputs a starter current to a first terminal, and a starter current stop control part which controls output stop of the starter current; and a started circuit part which is supplied with the starter current via the first terminal and which increases or decreases an internal current in accordance with the starter current and generates at the first terminal a voltage depending upon the internal current, wherein the starter current supply part includes a first MOS transistor connected at a drain thereof to the first terminal, and a first current supply circuit which is connected at a first end thereof to a source of the first MOS transistor and which outputs a first current in response to an internal signal input from inside of the starter circuits, and a gate bias of the first MOS transistor increases or decreases depending upon a starter current stop control current, the starter current stop control part supplies the starter current stop control current obtained from the internal current of the started circuit by using an approximate current mirror to a node between the source of the first MOS transistor and the first current supply circuit, and if the starter current is zero and the internal current has a value which is at least a first current value, then the internal current increases up to a second current value and settles, whereas if the starter current is zero and the internal current has a value which is less than the first current value, then the internal current settles with a current value which is less than the second current value.

16. The CMOS bias circuit according to claim 15, wherein the starter current stop control part comprises:

a gate bias circuit for the first MOS transistor;

a second current supply circuit which outputs a second current; and a current changeover circuit which changes over a path for the second current based on the voltage at the first terminal either to lead the second current to the gate bias circuit and increase the gate bias of the first MOS transistor or to lead the second current to a node between the source of the first MOS transistor and the first current supply circuit to supply the second current as the starter current stop control current, wherein if the voltage at the first terminal indicates that the internal current is less than the first current value, the second current is led to the gate bias circuit, whereas if the voltage at the first terminal indicates that the internal current is at least the first current value, the second current is led to the node between the source of the first MOS transistor and the first current supply circuit.

17. The CMOS bias circuit according to claim 15, wherein the first current supply circuit includes a second MOS transistor connected at a drain thereof to the source of the first MOS transistor, and has a current flowing through the second MOS transistor as an output thereof, and the starter current stop control part includes a third MOS transistor connected at a drain thereof to the gate of the first MOS transistor, connected at a gate thereof to a node between the source of the first MOS transistor and the drain of the second MOS transistor, and connected at a source thereof to a source of the second MOS transistor.

18. The CMOS bias circuit according to claim 15, wherein the first current supply circuit is a MOS transistor.

19. The CMOS bias circuit according to claim 16, wherein the first current supply circuit is a MOS transistor.

20. The CMOS bias circuit according to claim 16, wherein the second current supply circuit is a MOS transistor.

* * * * *